(12) United States Patent
Aoyagi et al.

(10) Patent No.: US 6,788,725 B2
(45) Date of Patent: Sep. 7, 2004

(54) SEMICONDUCTOR LASER DEVICE

(75) Inventors: Toshitaka Aoyagi, Tokyo (JP); Go Sakaino, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/987,259

(22) Filed: Nov. 14, 2001

(65) Prior Publication Data

US 2003/0091080 A1 May 15, 2003

(51) Int. Cl.$^7$ ............................................. H01S 3/08
(52) U.S. Cl. .......................... 372/102; 372/45; 372/46
(58) Field of Search ........................... 372/45, 46, 102

(56) References Cited

U.S. PATENT DOCUMENTS

| | | | | |
|---|---|---|---|---|
| 5,347,526 A | * | 9/1994 | Suzuki et al. | 372/46 |
| 5,412,496 A | * | 5/1995 | Nakajima et al. | 372/45 |
| 5,960,023 A | * | 9/1999 | Takahashi | 372/45 |

FOREIGN PATENT DOCUMENTS

| | | |
|---|---|---|
| JP | 1-155677 | 6/1989 |
| JP | 2-20087 | 1/1990 |
| JP | 2-90688 | 3/1990 |
| JP | 5-48197 | 2/1993 |
| JP | 6-204607 | 7/1994 |

OTHER PUBLICATIONS

Whiteaway et al., "The Design And Assessment Of λ/4 Phase–Shifted DFB Laser Structures", IEEE Journal of Quantum Electronics, vol. 25, No. 6, Jun. 1989, pp. 1261–1279.

Sakaino et al., "Transmission Characteristics Of Uncooled And Directly Modulated 1.3 Micrometers Distributed Feedback Laser Diode For Serial 10Giga Bit Ethernet" Conference Digest, 2000 IEEE 17$^{th}$ International Semiconductor Laser Conference, Sep. 2000, pp. 89–90.

Sakaino et al., "Uncooled And Directly Modulated 1.3μm DFB Laser Diode For Serial 10Gb/s Ethernet", ECOC 2000, 26$^{th}$ European Conference on Optical Communication, Sep. 2000, pp. 125–126.

Shin et al., "Low Threshold Current Density Operation Of GaInAsP–InP Laser With Multiple Reflector Microcavities", IEEE Photonics Technology Letters, vol. 7, No. 10, Oct. 1995, pp. 119–1121.

Hillmer et al., "1.53 ξm InGaAsP–InP First–Order λ/4–Shifted Distributed Feedback Lasers With High Coupling Coefficients", IEEE Journal of Quantum Electronics, vol. 27, No. 6, Jun. 1991, pp. 1753–1758.

Hillmer et al., "Realization Of High Coupling Coefficients In 1.53 μm InGaAsP/InP First–Order Quarter–Wave Shifted Distributed Feedback Lasers", Applied Physics Letters, vol. 57, No. 6, Aug. 1990, pp. 534–536.

* cited by examiner

*Primary Examiner*—Don Wong
*Assistant Examiner*—Cornelius H. Jackson
(74) *Attorney, Agent, or Firm*—Leydig, Voit & Mayer, Ltd.

(57) ABSTRACT

An n-InP second upper cladding layer is laid on a p-InP lower cladding layer while an active layer having upper and lower boundary surfaces that are uniformly flat in an optical waveguide direction is interposed therebetween. A diffraction layer having a phase-shifted structure in the optical waveguide direction is interposed between the lower cladding layer and the active layer or between the second upper cladding layer and the active layer. The length L of the diffraction grating layer in the direction of the optical waveguide is $L \leq 260$ μm; a mean coupling factor κ of a diffraction grating layer is $\kappa \geq 150$ cm$^{-1}$; and κL satisfies $5.6 > \kappa L > 3.0$.

16 Claims, 4 Drawing Sheets

SEMICONDUCTOR LASER DEVICE

BACKGROUND OF THE INVENTION

1. Field of the Invention

The present invention relates to a semiconductor laser device, and, more particularly, to a semiconductor laser device having a diffraction grating layer with a phase shift structure used for optical communication.

2. Description of the Related Art

In response to demand for a large-capacity, long-distance information transmission system, development of an optical transceiver has recently been pursued, with a view towards attaining a transmission rate of 10 Gbps.

A distributed feedback semiconductor laser having a diffraction grating provided in the direction of an optical waveguide effects optical feedback corresponding to the period of the diffraction grating, thus enabling single-mode emission. Thus, the distributed feedback semiconductor laser has been developed for optical communication.

Japanese Patent Application Laid-Open No. Hei. 1-155677 describes an invention pertaining to a distributed feedback (DFB) semiconductor laser. In relation to a related-art DFB semiconductor laser, the positional relationship between reflection surfaces provided at both ends of the laser in the direction of an optical waveguide and the phase of the diffraction grating affects an oscillation characteristic having a single longitudinal mode. For this reason, a $\lambda/4$ phase-shifted structure has been employed, and both end surfaces of the laser are covered with a non-reflection coating, thereby minimizing the reflectance of the end faces. If the product of a coupling factor $\kappa$ and a cavity length L, that is, $\kappa L$, is not in the vicinity of a value of 1.25, an axial hole burning phenomenon arises, and, in turn, deteriorates a single longitudinal mode characteristic of the laser. In order to solve the problem, there is described a DFB semiconductor laser, in which the reflectance of optical power of one end surface is set to 30% and the reflectance of the other end is set to 5 to 15%, thereby achieving a $\kappa L$ value of $0.4 \leq \kappa L \leq 1.3$.

The related-art DFB semiconductor laser induces an axial hole burning phenomenon when the product of a coupling factor $\kappa$ and a cavity length L, that is, $\kappa L$, is not in the vicinity of a value of 1.25, thus deteriorating a single longitudinal mode characteristic of the laser. A high-precision, non-reflection coating technique has been pursued, and there has been devised a window structure for embedding end-face sections of a waveguide for minimizing the reflectance of the end faces. In light of the above-described drawbacks, Japanese Patent Application Laid-Open No. Hei. 2-20087 describes a DFB semiconductor laser which is comparatively easy to manufacture and has a structure capable of realizing a single longitudinal mode at high yield. The DFB semiconductor laser has one or more phase shift regions within 20% of the resonance length with reference to the center of the cavity. The reflectance of respective end faces is set to 5 to 15%, and the product $\kappa L$ is set to the range of $0.6 \leq \kappa L \leq 1.0$.

In relation to the related-art DFB semiconductor laser, the diffraction grating is adjusted such that the product of a coupling factor $\kappa$ and a cavity length L, that is, $\kappa L$, assumes a value of 1.2 to 1.3. However, such a semiconductor laser involves a high oscillation threshold current and it tends to saturate in optical output more than other DFB semiconductor lasers under high-temperature operation. To solve the problem, Japanese Patent Application Laid-Open No. Hei. 2-90688 describes a $\lambda/4$ phase-shifted DFB semiconductor laser. In relation to the laser, an optical guide layer is provided between an active layer and a cladding layer, wherein the thickness of the optical guide layer changes at a period which is an integer multiple of half the wavelength of traveling light. Further, the energy gap of the optical guide layer is greater than that of the active layer and smaller than that of the cladding layer. The product of a coupling factor $\kappa$ and a cavity length L, that is, $\kappa L$, is set to a value of 1.5 to 2.5.

In relation to the related-art DFB semiconductor laser, a multilayer dielectric film is formed on an output end face of the laser, thereby reducing optically-induced return noise. This also drastically reduces optical output from the output end face. In order to reduce the optically-induced return noise and to ensure sufficient optical output, Japanese Patent Application Laid-Open No. Hei. 5-48197 describes a $\lambda/4$ phase-shifted DFB semiconductor laser which is constructed as follows. Namely, the output end face of the laser is covered with a non-reflective coating. Provided that a length from a rear end face to a $\lambda/4$ phase shift point is taken as Ls and the length of a laser cavity is taken as L, $\lambda/4$ phase shift is located in a position where $0.2 \leq Ls/L \leq 0.4$ is obtained. Further, the product of a coupling factor $\kappa$ and a cavity length L, that is, $\kappa L$, is set to the range of $2 \leq \kappa L \leq 4$. The laid-open patent publication states that, when measurement was effected through use of an element having a cavity length of 300 $\mu$m, superior single-mode oscillation was ascertained to arise even at a $\kappa L$ value of about 3, and good current-light output was obtained.

Japanese Patent Application Laid-Open No. Hei. 6-204607 describes an improvement in the yield and efficiency of a DFB semiconductor laser, including an analog modulation distortion characteristic and a single-mode characteristic. In order to obtain a low-cost, low-distortion analog modulation DFB semiconductor laser, there is employed a structure wherein the reflectance of the front end face of the cavity is less than 5% and wherein the product of a coupling factor $\kappa$ and a cavity length L, that is, $\kappa L$, is set to the range of $0.4 \leq \kappa L \leq 1.0$.

Further, the related-art $\lambda/4$ phase-shifted DFB semiconductor laser element has encountered difficulty in achieving compatibility of high stability of single mode, a high-yield characteristic, and a high efficiency-and-output characteristic. For this reason, Japanese Patent Application Laid-Open No. Hei. 11-68220 describes a DFB semiconductor laser, wherein a low-reflection film is formed on an optical output end face and wherein a high-reflection film is formed on the other end face. Further, a diffraction grating is formed in a part of the element in the direction toward the cavity. The length of an area where the diffraction grating is to be fabricated is set to 52% to 64% the element length. The product of a coupling factor of the diffraction grating and the length of the diffraction grating fabrication area is set to the range of 0.8 to 2.

On pp. 1261 to 1279 of IEEE JOURNAL OF QUANTUM ELECTRONICS, VOL. 25, NO. 6, JUNE 1989, James E. A. Whiteaway et al. describe a $\lambda/4$ phase-shifted DFB semiconductor laser whose active layer does not have the function of a diffraction grating. In relation to the laser, under the conditions where the length L of a diffraction grating area is 50 to 600 $\mu$m and a $\kappa L$ value produced from a coupling factor $\kappa$ and the length L of the diffraction grating area falls within a range of 3.0 or less, there result a certain distribution of threshold current (see FIG. 11 on p. 1271), a certain distribution of threshold current density (see FIG. 12 on p.

1271), and a certain distribution of efficiency (see FIG. 13 on p. 1272). According to the figures, the shorter L and the greater the κL value, the smaller the threshold current. Moreover, the longer L and the greater the κL value, the smaller the threshold current density. It is understood that the smaller L and the smaller the κL value, the greater the efficiency.

However, no detailed descriptions are given of high-speed-operation characteristic and the stability of single axial mode characteristic. The report may provide a highly-efficient structure having a low threshold current density but has failed to disclose a structure possessing a sufficient high-speed-operation characteristic and a stable single axial mode characteristic.

On pp. 125 to 126, ECOC 2000 26$^{th}$ European Conference on Optical Communication, Proceedings Volume 1: Monday, Sep. 4, 2000, G. Sakaino et al. reported a phase-shifted DFB semiconductor laser. The laser has an active layer made of InGaASP-based material, a cavity length as short as 200 μm, and a diffraction grating of high κL value. An active layer of the laser does not have any function of a diffraction grating. However, the relaxation oscillation frequency, which is one factor for limiting high-speed-operation of a laser, remains at a value of less than 15 GHz (14.9 GHz stated in the paper).

On pp. 89 to 90, 2000 IEEE 17$^{TH}$ International Semiconductor Laser Conference 25 to 28 Sep. 2000 Hyatt Monterey, Monterey Calif., CONFERENCE DIGEST P13, G. Sakaino et al. reported a phase-shifted DFB semiconductor laser. The laser has an active layer made of InGaAsP-based material, a cavity length as short as 200 μm, and a diffraction grating having a high κL value. An active layer of the laser does not have any function of a diffraction grating. In relation to the laser, the relaxation oscillation frequency remains at a value of 12.0 GHz or thereabouts.

If the relaxation oscillation frequency is low, relaxation oscillation cannot be removed even when a receiver employs an electric filter. As a result, the sensitivity of the receiver is deteriorated, thus posing a problem in attaining 10 Gb/s operation.

In order to achieve a transmission rate of 10 Gb/s, a relaxation oscillation frequency of 30 GHz or more is desired. However, it is empirically seen that, if a relaxation oscillation frequency of 15 GHz or more is not obtained, a sufficient eye-pattern opening will not be obtained, thus inducing non_negligible deterioration in receiving sensitivity.

Moreover, IEEE PHOTONICS TECHNOLOGY LEFITERS, VOL. 7, NO. 10, OCTOBER 1995, PP. 1119 to 1121 reports a multiple reflection short-length cavity of active layer isolation type having a λ/4 phase-shifted structure.

Appl. Phys. Lett. 57(6), Aug. 6, 1990, pp. 534 to 536 reports a λ/4 phase-shifted DFB semiconductor laser having a κL value of 9.

IEEE JOURNAL OF QUANTUM ELECTRONICS, VOL. 27, NO. 6, JUNE 1991 pp. 1753–1758 describes a λ/4 phase-shifted DFB semiconductor laser having a device length of 172 μm, a coupling factor κ of 330 cm$^{-1}$, and a κL value of 5.6.

SUMMARY OF THE INVENTION

The present invention has been made to overcome the above-described drawbacks and disadvantages of the related art. It is an object of the present invention to provide a semiconductor laser having a low threshold current density/high efficiency characteristic, a sufficient high-speed-operation characteristic, and a stable single axial mode characteristic.

According to one aspect of the invention, there is provided a semiconductor laser device comprising: a semiconductor substrate of first conductivity type; a first cladding layer of first conductivity type provided on the semiconductor substrate; an active layer provided on the first cladding layer and having uniformly flat upper and lower boundary surfaces in the direction of an optical waveguide; a second cladding layer of second conductivity type provided on the active layer, and a diffraction grating layer having a phase-shifted structure, provided in the direction of the optical waveguide between the first cladding layer and the active layer or between the second cladding layer and the active layer, wherein the length L of the diffraction grating layer in the direction of the optical waveguide is taken as L≦260 μm; a mean coupling factor κ of a diffraction grating layer is taken as κ≧150 cm$^{-1}$; and a value κL, which is the product of the length L and the mean coupling factor κ, is taken as 5.6>κL>3.0, whereby the present invention can achieve a semiconductor laser device having a high relaxation oscillation frequency fr, a stable single axial mode, and sufficient slope efficiency.

Accordingly, the present invention enables configuration of a low-cost, highly-reliable semiconductor laser having a superior high-speed characteristic. Hence, there can be constructed a low-cost transmission system of 10 Gb/s or more.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

Semiconductor lasers according to the embodiments are information communication semiconductor lasers for use in a transmission system having a transmission rate of, e.g., 10 Gb/s. More specifically, the semiconductor lasers are λ/4 phase-shifted DFB semiconductor lasers whose active layer does not have the function of a diffraction grating.

First Embodiment

Figure 1:
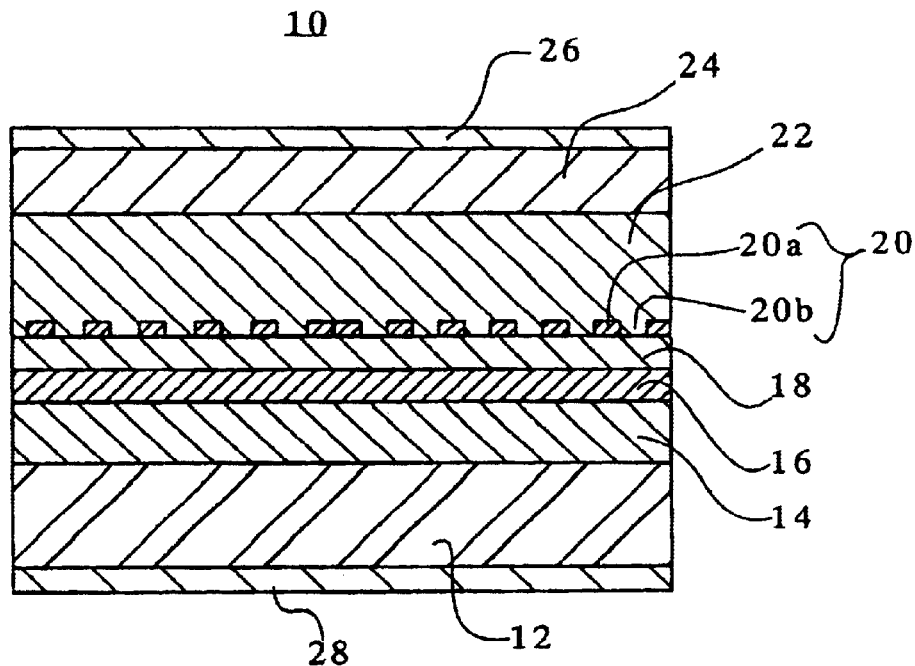
FIG. 1 is a cross-sectional view of a semiconductor laser according to an embodiment of the present invention taken along a direction of an optical waveguide thereof.

FIG. 1 is a cross-sectional view of a semiconductor laser according to a first embodiment of the present invention taken along a direction of an optical waveguide.

As shown in FIG. 1, reference numeral 10 designates a semiconductor laser; more specifically, a distributed feedback semiconductor laser having a quarter-wave phase-shifted structure (hereinafter called simply "λ/4 phase-shifted DFB laser").

Reference numeral 12 designates an InP substrate of p-conductivity type serving as a semiconductor substrate (hereinafter a p-conductivity type is simply expressed as "p-" and an n-conductivity type is expressed as "n-"); 14 designates a lower p-InP cladding layer which is laid on the p-InP substrate 12 and acts as a first cladding layer; and 16 designates an active layer of InGaAsP-based material laid on the lower cladding layer 14. For instance, the active layer is a multiple quantum structure active layer comprising, e.g., five to fifteen quantum well layers. Upper and lower surfaces of the active layer 16 are uniformly flat in the direction of the optical waveguide. The active layer 16 does not have the function of a diffraction grating.

Reference numeral 18 designates a first upper n-InP cladding layer which is laid on the active layer 16 and acts as a second cladding layer. The first upper cladding layer 18 has a thickness of 0 nm to 100 nm or thereabouts. In the present embodiment, the first upper cladding layer 18 is provided in the laser element. However, in some cases, an optical guide having the function of an adjacent optical confinement layer may be provided in lieu of the first upper cladding layer 18.

Reference numeral 20 designates a diffraction grating layer having an embedded diffraction grating structure. The diffraction grating layer 20 comprises high-refractive-index portions 20a and low-refractive-index portions 20b. In the first embodiment, the high-refractive-index portions 20a are formed from InGaAsP. As will be described later, the low-refractive-index portions 20b are formed from InP. The diffraction grating layer 20 has a thickness ranging from 50 nm to 300 nm. The diffraction grating formed from the diffraction grating layer 20 assumes a composition wavelength of 1.1 μm to 1.4 μm or thereabouts. The length L of a diffraction grating region assumes a desired value within the range of 0 μm to 260 μm. In the semiconductor laser 10, the length of the laser element with reference to the direction of the optical waveguide is identical with the length L of the diffraction grating region; that is, the length of the diffraction grating. Moreover, the length L of the diffraction grating region may constitute a part of the length of the laser element with reference to the direction of the optical waveguide.

Reference numeral 22 designates a second upper n-InP cladding layer which is laid on the diffraction grating layer 20 and acts as the second cladding layer. In the semiconductor laser 10, the second upper cladding layer 22 embeds the high-refractive-index portions 20a of the diffraction grating layer 20. The low-refractive-index portions 20b of the diffraction grating layer 20 are formed from the same InP as that of the second upper cladding layer 22.

Reference numeral 24 designates an n-InP contact layer laid on the second upper cladding layer; 26 designates an n-type electrode laid on the contact layer 24; and 28 designates a p-type electrode provided on the back surface of the p-InP substrate 12.

Next will be described the range of the length L of the diffraction grating region, the range of the mean coupling factor κ determined by the overall length L of the diffraction grating region, and the range of the κL value, which is the product of the length L of the diffraction grating region and the coupling factor κ, such that a stable single mode characteristic and a high relaxation oscillation frequency can be achieved simultaneously.

Provided that no reflection arises in both end surfaces of the laser 10 in the direction of the optical waveguide, a relaxation oscillation frequency fr of the λ/4 phase-shifted DFB laser can be expressed by Eq. 1.

$$fr = \{1/(2\pi)\} \times [\{(\Gamma \cdot g' \cdot Po \cdot \lambda p)/(h \cdot S \cdot L \cdot n)\} \times \{(\alpha i/\alpha th)+1\}]^{1/2} \quad (1)$$

Here, Γ designates a coefficient for confining light in the active layer. When the active layer is of quantum well structure, Γ means a sum of coefficients for confining light into all the quantum well structures layers. Reference symbol g' denotes a differential gain; Po denotes a sum of optical outputs exiting both end surfaces; λp denotes an oscillation wavelength; "h" denotes Planck's constant; and S denotes a cross-sectional area of the active layer. When the active layer has a quantum well structure, S denotes a sum of cross-sectional areas of all quantum well layers; L denotes the length of an area where diffraction gratings are fabricated (the length of a diffraction grating region); "n" denotes a mean equivalent refractive index to which light is susceptible in the element; αi denotes an internal loss (power) per unit length; and αth denotes a power threshold gain per unit length. Here, the power threshold gain αth is determined by means of dividing a power threshold gain αth·L by L, wherein the αth·L is determined by the κL value, which is the product of the coupling factor κ of the diffraction grating and the length L of the diffraction grating area.

The dependence of the power threshold value gain αth·L on the value κL can be computed through use of, e.g., an F-matrix method reported by Yamada et al. in the Institute of Electronics, Information and Communication Engineers, Technical Report OQE84-79, 1984.

Figure 2:
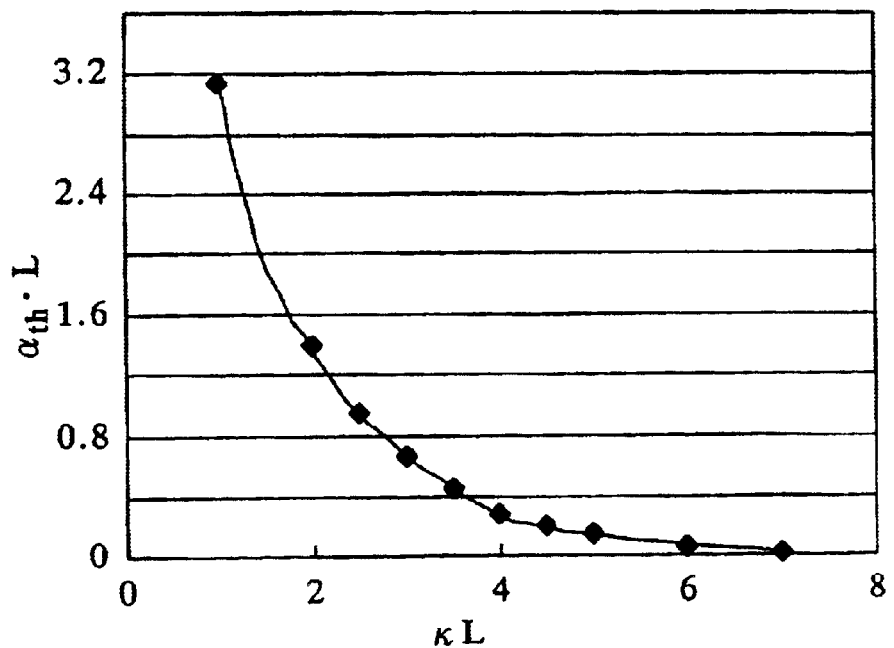
FIG. 2 is a graph showing the dependence, on the value κL, of the power threshold value gain αth·L of the semiconductor laser according to an embodiment of the present invention.

FIG. 2 is a graph showing the dependence, on the value κL, of the power threshold value gain αth·L of the semiconductor laser according to the present invention. In FIG. 2, the vertical axis represents αth·L, and the horizontal axis represents κL.

Figure 3:
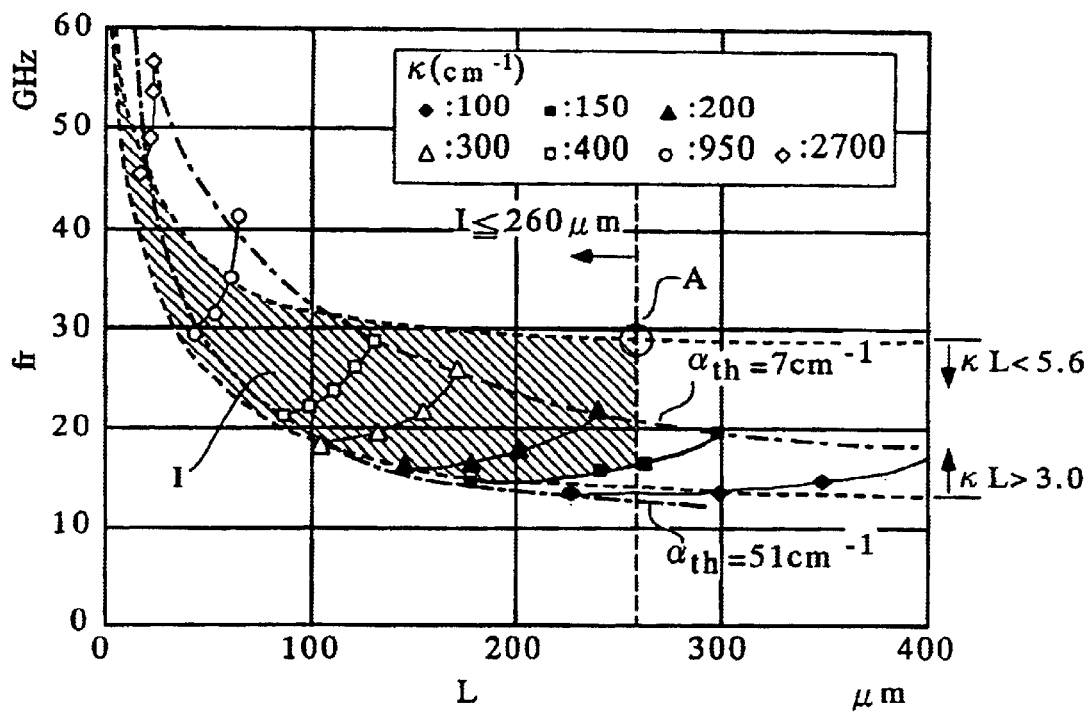
FIG. 3 is a graph relating to a semiconductor laser according to an embodiment of the present invention, showing the dependence, on the length L of the diffraction grating area, of the relaxation oscillation frequency "fr" using the coupling factor κ as a parameter.

For example, a DFB laser which has an InGaAsP-based active layer and is operated at a waveband of 1.3 μm is taken as an example. Here, laser parameters are Γ:0.06, g':2.5E-19($m^2$) (here E-19 means $10^{-19}$, and the same convention applies to any counterparts in the following descriptions); Po:5 (mW), λp:1.3 (μm), h:6.33E-34 (J·s), S:8.64E-14 ($m^2$), n:3.25, and αi:20 ($cm^{-1}$). Through use of the laser parameters and the result shown in FIG. 2, the dependence, on the length L of the diffraction grating region, of the relaxation oscillation frequency fr using κ as a parameter is computed. FIG. 3 shows a result of computation.

FIG. 3 is a graph relating to a semiconductor laser according to the first embodiment, showing the dependence, on the length L of the diffraction grating area, of the relaxation oscillation frequency "fr" using the coupling factor κ as a parameter.

As shown in FIG. 3, the vertical axis represents the relaxation oscillation frequency fr, and the horizontal axis represents the length L of the diffraction grating region. A hatched region I satisfies $3.0<\kappa L<5.6$, $\kappa \geq 150$ (cm$^{-1}$), and $L \leq 260$ μm.

As shown in FIG. 3, $fr \geq 15$ GHz can be achieved, by means of adopting $\kappa L>3.0$ and $\kappa \geq 150$ (cm$^{-1}$). In this regard, when $\kappa L>3.4$ and $\kappa L>3.6$ are employed, $fr \geq 15.5$ GHz and $fr \geq 15.7$ GHz are obtained. Thus, fr can be more reliably set to a value of 15 GHz or more.

Figure 4:
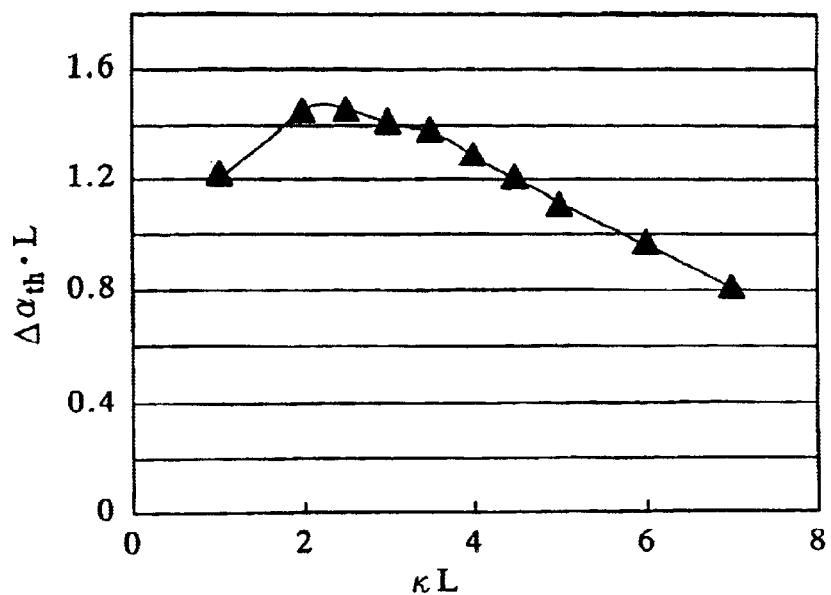
FIG. 4 is a graph relating to a semiconductor laser according to an embodiment of the present invention, showing the dependence of Δαth·L on κL.

FIG. 4 is a graph relating to a semiconductor laser according to the first embodiment, showing the dependence of $\Delta \alpha th \cdot L$ on $\kappa L$.

Achievement of a stable single axial mode at the time of high-speed modulation requires a certain threshold power gain difference between the principal axis mode and the sub-axis mode; that is, $\Delta \alpha th \cdot L \geq 1.0$ must be satisfied. As shown in FIG. 4, when $\kappa L \leq 5.8$ is employed, $\Delta \alpha th \cdot L \geq 1.0$ is satisfied. So long as actual allowance is taken into account, a stable single axial mode is achieved even at high-speed modulation of 10 Gb/s by means of adopting $\kappa L<5.6$.

A single-sided slope efficiency $\eta s$ is expressed by Eq. 2.

$$\eta s = 0.62 \cdot \eta i \cdot \alpha th / \{\lambda p \cdot (\alpha i + \alpha th)\} \tag{2}$$

where $\eta i$ represents an internal quantum efficiency.

In connection with Eq. 2, when $\eta i$: 0.8, $\lambda p$: 1.3 μm, $\alpha i$: 20 cm$^{-1}$, and $L \leq 260$ μm are employed, $\eta s=0.05$ W/A can be obtained. Efficiency sustainable in practical use can be achieved even in the vicinity of point A shown in FIG. 3 where efficiency reaches a minimum within the range of $\kappa L<5.6$.

As mentioned above, in relation to the phase-shifted DFB laser according to the present invention, so long as conditions for region I shown in FIG. 3 is satisfied; that is, $3.0<\kappa L<5.6$, $\kappa \geq 150$ cm$^{-1}$, and $L \leq 260$ μm, there can be achieved a laser having a high relaxation oscillation frequency fr, a superior high-speed characteristic, a stable single axial mode, and sufficient slope efficiency. Accordingly, there can be manufactured a low-cost, highly-reliable semiconductor laser having a superior high-speed characteristic. Thus, there can inexpensively constructed a transmission system of 10 Gb/s or more.

Second Embodiment

A semiconductor laser according to a second embodiment of the present invention is identical in configuration with that described in connection with the first embodiment. At the time of fabrication of the semiconductor laser, the power threshold gain $\alpha th$ per unit length in the principal axis mode is specified.

Figure 5:
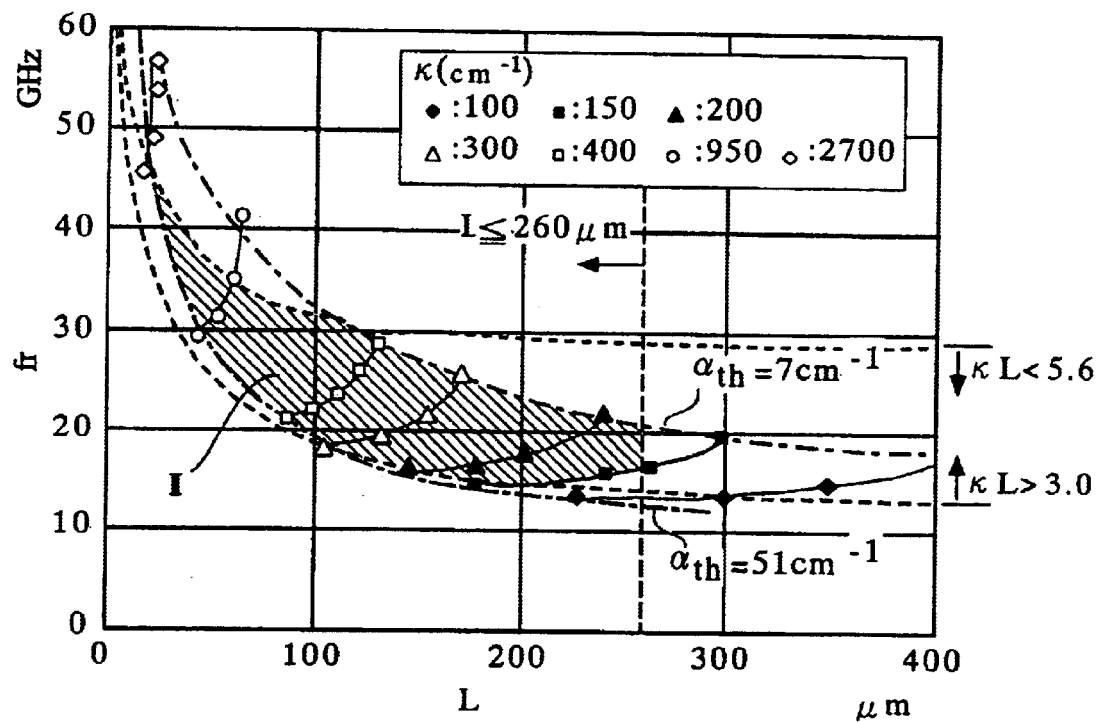
FIG. 5 is a graph showing the dependence, on the length L of the diffraction grating region of the relaxation oscillation frequency fr using as a parameter the coupling coefficient κ of the semiconductor laser according to an embodiment of the present invention.

FIG. 5 is a graph showing the dependence, on the length L of the diffraction grating region, of the relaxation oscillation frequency fr using as a parameter the coupling coefficient $\kappa$ of the semiconductor laser according to the second embodiment.

As shown in FIG. 5, the vertical axis represents a relaxation oscillation frequency fr, and the horizontal axis represents the length L of the diffraction grating region. In addition, a hatched region II satisfies $3.0<\kappa L<5.6$, $\kappa \geq 150$ cm$^{-1}$, $L \leq 260$ μm, and $7$ cm$^{-1} \leq \alpha th \leq 51$ cm$^{-1}$.

Eq. 3 is an empirical equation of threshold current density Jth(kA/cm$^2$).

$$Jth = 68.6 \cdot (\alpha i + \alpha th) + 109.4 \tag{3}$$

For example, when about 10 multiple quantum wells are employed, the threshold current density Jth of the $\lambda/4$ phase-shifted DFB laser at a waveband of 1.3 μm is 2.0 to 5.0 kA/cm$^2$ in the region II where $7$ cm$^{-1} \leq \alpha th \leq 51$ cm$^{-1}$ is employed, provided that the internal loss (power) $\alpha i$ per unit length is taken as 20 cm$^{-1}$.

Provided that internal quantum efficiency $\eta i=0.8$, oscillation wavelength $\lambda p=1.3$ μm, and internal loss (power) per unit length $\alpha i=20$ cm$^{-1}$, $\eta s=0.10$ to 0.27 W/A is derived from Eq. 2 as the single-side slope efficiency $\eta s$.

As mentioned above, in relation to the semiconductor laser according to the second embodiment, a $\lambda/4$ phase-shifted DFB laser having a considerably practical low threshold current density and a high slope efficiency characteristic is obtained by means of satisfying $3.0<\kappa L<5.6$, $\kappa \geq 150$ cm$^{-1}$, $L \leq 260$ μm, and $7$ cm$^{-1} \leq \alpha th \leq 51$ cm$^{-1}$. Since a drive current can be set low, the reliability of the laser is high, and optical power can be ensured. Hence, there can be fabricated a semiconductor laser capable of transmitting light over a long distance.

Third Embodiment

Figure 6:
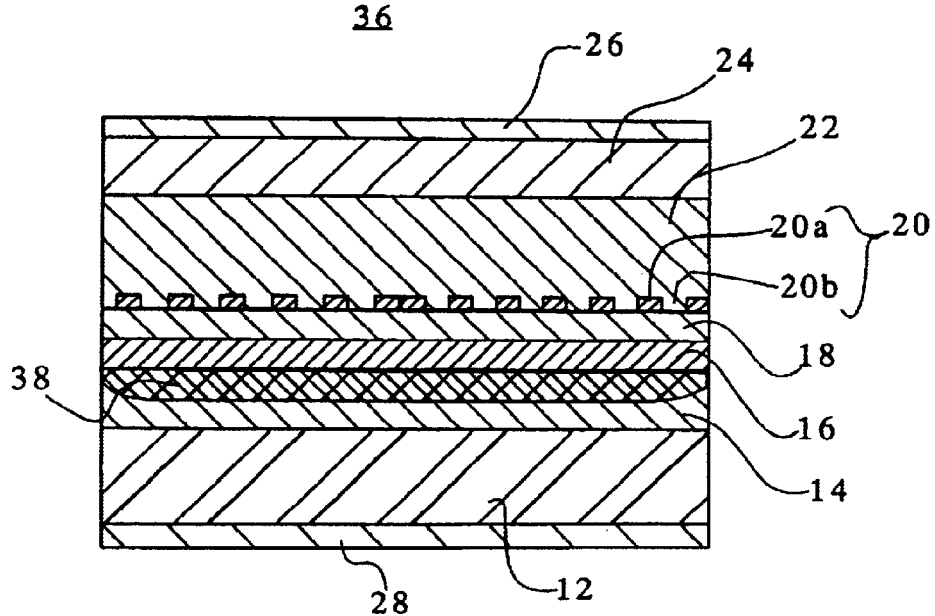
FIG. 6 is a cross-sectional view of a semiconductor laser according to an embodiment of the present invention, taken along a direction of an optical waveguide thereof.
Figure 7:
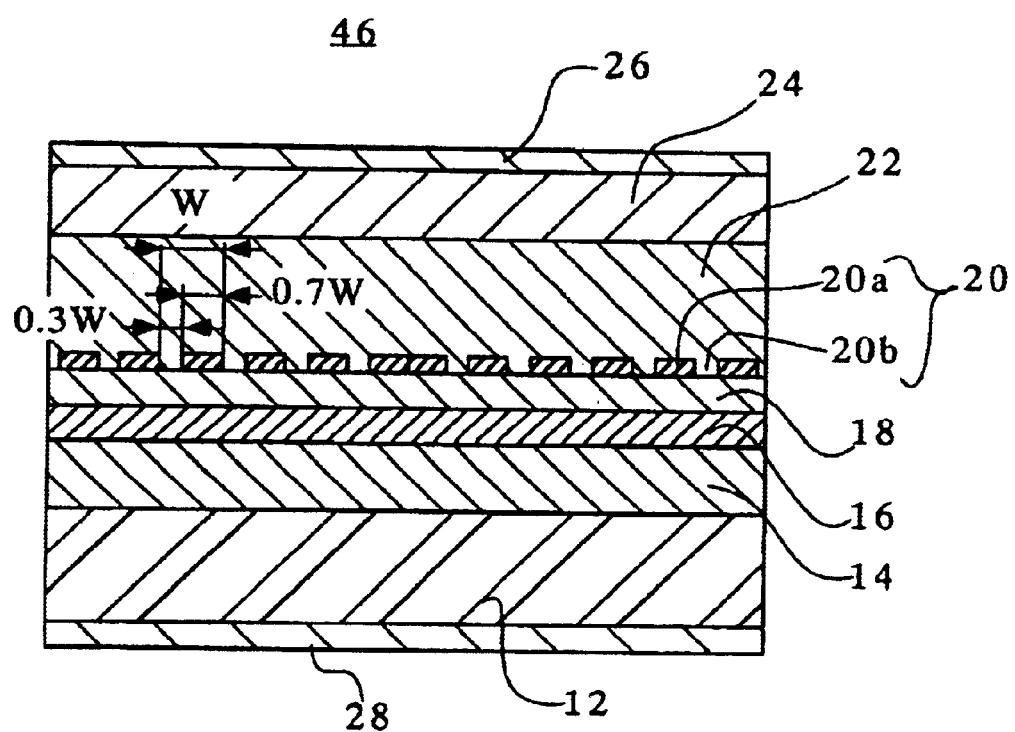
FIG. 7 is a cross-sectional view of a semiconductor laser according to an embodiment of the present invention, taken along a direction of an optical waveguide thereof.

FIG. 6 is a cross-sectional view of a semiconductor laser according to a third embodiment of the present invention taken along a direction of an optical waveguide thereof. In FIGS. 6 and 7, reference symbols identical with those provided in FIG. 1 designate identical or corresponding elements.

Reference numeral 36 designates a semiconductor laser; more specifically, $\lambda/4$ phase-shifted DFB laser. Reference numeral 38 designates a heavily-doped region, where a carrier concentration of p-type dopant is within the range of beyond 1E+18 cm$^{-3}$ to 3.0E+18 cm$^{-3}$ or less. P-type impurities include Zn, Be, and Mg. In the present embodiment, the heavily-doped region 38 is provided on the p-InP lower cladding layer 14 as a layer proximate to the active layer. If a p-optical guide layer is provided, the heavily-doped region 38 may be provided on the p-optical guide layer or on a part of the active layer.

In general, if a part of the semiconductor through which light is to travel is doped with p-type impurities with a carrier concentration of 1E+18 cm$^{-3}$ or more, $\alpha i$ increases sharply.

As can be seen from Eq. 1, the relaxation oscillation frequency can be increased by means of increasing $\alpha i$, thus further improving the high-speed characteristic of a semiconductor laser.

Fourth Embodiment

A semiconductor laser according to a fourth embodiment is identical in configuration with those described in connection with the first through third embodiments. At the time of configuration of the semiconductor laser, the composition wavelength of the diffraction grating is set in the vicinity of the oscillation wavelength, thereby ensuring a larger coupling factor $\kappa$.

In general, so long as a phase-shifted DFB laser whose active layer does not have the function of a diffraction grating; that is, so long as a phase-shifted DFB laser whose active layer is not divided has a diffraction grating that does not have an extremely high absorption characteristic relative to the oscillated light, there is achieved a diffraction grating exhibiting nearly pure indexing coupling. Hence, a superior single mode characteristic can be achieved readily by means of a $\lambda/4$ phase-shifted structure.

However, the active layer where the highest light intensity is present does not have the function of a diffraction grating. For this reason, difficulty is encountered in realizing requirements for, particularly, a region in the region I shown in FIG. 3 in connection with the first embodiment and a region in the region II shown in FIG. 5 in connection with the second embodiment, these regions requiring particularly large coupling factor.

The configuration of the semiconductor laser according to the fourth embodiment sets a relationship between the composition wavelength and oscillation wavelength of the diffraction grating, so as to ensure a large coupling factor κ.

When the composition wavelength of the diffraction grating is taken as λg (nm) and the oscillation wavelength of the same is taken as λp (nm), periodic variations in refractive index attributable to the diffraction grating become smaller when λg becomes smaller than (λp−100) nm, thus posing difficulty in achieving a large coupling factor κ. In contrast, when λg becomes greater than (λp+100) nm, absorption of oscillated light is nonnegligible, and threshold current density and slope efficiency are deteriorated significantly.

If the composition wavelength λg is set by Eq. 4, periodic variations in refractive index attributable to the diffraction grating become sufficiently large while absorption of oscillated light by the diffraction grating is suppressed as much as possible, thus providing a larger coupling factor κ.

$$\lambda p-100 \text{ nm} \leq \lambda g \leq \lambda p+100 \text{ nm} \quad (4)$$

More specifically, in the case of a semiconductor laser having an oscillation wavelength λp of, e.g., 1.3 μm, the composition wavelength λg of the diffraction layer 20 having a λ/4 phase-shifted structure is set so as to fall within the range of 1.2 μm to 1.4 μm.

The semiconductor laser according to the present embodiment makes it possible to readily increase the coupling factor κ of the diffraction grating. Since the relaxation oscillation frequency can be increased readily, there can be fabricated a semiconductor laser having a superior high-speed characteristic.

Fifth Embodiment

FIG. 7 is a cross-sectional view of a semiconductor laser according to a fifth embodiment of the present invention, taken along a direction of an optical waveguide.

Reference numeral 46 designates a semiconductor laser; particularly, a λ/4 phase-shifted DFB laser.

In the present embodiment, the length of a period consisting of the highly-refractive portion 20a of the diffraction grating layer 20 and the low-refractive portion 20b of the same is taken as W. The length of the highly-refractive portion 20a is set beyond 0.5 W, and the diffraction grating layer 20 has at least several periods of such highly-refractive portions 20a. More specifically, a larger coupling factor κ is realized, by means of setting the duty ratio of the highly-refractive portions 20a to a value beyond 50%.

In relation to the semiconductor laser 46, the diffraction grating layer 20 is constituted by means of setting the highly-refractive portions 20a to 0.7 W and the low-refractive portions 20b to 0.3 W, thus setting the duty of the highly-refractive portions 20a to 70%.

The equivalent refractive index of a region located in the vicinity of the diffraction grating layer 20 is increased, by means of increasing the duty of the highly-refractive portions 20. The light which is to propagate through the diffraction grating layer spreads much in the diffraction grating layer 20. Consequently, the intensity of the light confined to the diffraction grating layer 20 is increased, thus increasing the coupling factor κ.

The semiconductor laser according to the present embodiment enables an easy increase in coupling factor κ, thereby increasing the relaxation oscillation frequency of a semiconductor laser element. Hence, there can be constructed a semiconductor laser having a superior high-speed characteristic.

Since the semiconductor lasers according to the present invention have the foregoing construction, the following advantages are yielded.

According to one aspect of the invention, there is provided a semiconductor laser device comprising: a semiconductor substrate of first conductivity type; a first cladding layer of first conductivity type provided on the semiconductor substrate; an active layer provided on the first cladding layer and having uniformly flat upper and lower boundary surfaces in the direction of an optical waveguide; a second cladding layer of second conductivity type provided on the active layer; and a diffraction grating layer having a phase-shifted structure, provided in the direction of the optical waveguide between the first cladding layer and the active layer or between the second cladding layer and the active layer, wherein the length L of the diffraction grating layer in the direction of the optical waveguide is taken as L≦260 μm; a mean coupling factor κ of a diffraction grating layer is taken as κ≧150 cm$^{-1}$; and a value κL, which is the product of the length L and the mean coupling factor κ, is taken as 5.6>κL>3.0, whereby the present invention can achieve a semiconductor laser device having a high relaxation oscillation frequency fr, a stable single axial mode, and sufficient slope efficiency.

Accordingly, the present invention enables configuration of a low-cost, highly-reliable semiconductor laser having a superior high-speed characteristic. Hence, there can be constructed a low-cost transmission system of 10 Gb/s or more.

In another aspect, The semiconductor laser device according to the invention, wherein the power threshold gain αth per unit length in a principal axial mode is set to 7 cm$^{-1}$≦αth≦51 cm$^{-1}$, whereby a semiconductor laser device has a considerably practical low threshold current density.

Accordingly, there can be realized a semiconductor laser having low threshold current density and a high slope efficiency characteristic. Thus, high reliability and optical power can be ensured. Hence, there can be constructed a semiconductor laser capable of sending light over a long distance.

In still another aspect, the semiconductor laser device according to the present invention, further comprising: a heavily-doped region doped with p-type impurities at a carrier concentration of 10$^{18}$ cm$^{-3}$ in at least a portion of a layer of p-conductivity type located proximate to an active layer or a portion of the active layer, whereby the relaxation oscillation frequency can be increased.

Accordingly, There can be provided a semiconductor laser having a highly superior high-speed characteristic.

In yet another aspect, the semiconductor laser device according to the present invention, wherein there is further achieved λp−100≦λg≦λp+100, provided that a composition wavelength of the diffraction grating layer is taken as λg (nm) and an oscillation wavelength is taken as λp (nm), whereby periodic variations in refractive index attributable to the diffraction grating become sufficiently large while absorption of oscillated light by the diffraction grating is suppressed as much as possible.

Accordingly, the coupling factor κ of the diffraction grating can be readily increased, the relaxation oscillation frequency of the laser can be increased easily. There can be constructed a semiconductor laser having a superior high-speed characteristic.

In yet another aspect, the semiconductor laser device according to the present invention, wherein the length of a highly-refractive portion constituting diffraction grating of the diffraction grating layer is set so as to become longer than that of a low-refractive portion of the diffraction grating layer in the direction of the optical waveguide, whereby enabling an easy increase in coupling factor κ.

Accordingly, The relaxation oscillation frequency of a semiconductor laser element is increased. Hence, there can be constructed a semiconductor laser having a superior high-speed characteristic.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A semiconductor laser device comprising:
an InP substrate of a first conductivity type;
a first cladding layer of the first conductivity type disposed on the InP substrate;
an active layer including a multiple quantum well structure disposed on the first cladding layer and having uniformly flat upper and lower boundary surfaces in an optical waveguide direction;
a second cladding layer of a second conductivity type disposed on the active layer;
a diffraction grating layer having a phase-shifting structure in the optical waveguide direction, between the active layer and one of the first and second cladding layers, wherein
the diffraction grating layer has a length L in the optical waveguide direction greater than zero but not exceeding 260 $\mu$m;
mean coupling factor $\kappa$ of the diffraction grating layer is at least 150 cm$^{-1}$; and 5.6>$\kappa$L>3.0; and
power supply electrodes opposite each other, wherein the phase-shifting structure is interposed between the power supply electrodes.

2. The semiconductor laser device according to claim 1, wherein power threshold gain per unit length in a principal axial mode, $\alpha$th satisfies 7 cm$^{-1}$≤$\alpha$th≤51 cm$^{-1}$.

3. The semiconductor laser device according to claim 1, further comprising a heavily-doped p-type region having a carrier concentration of 10$^{18}$ cm$^{-3}$ in at least a portion of a p-type layer proximate at least a portion of the active layer.

4. The semiconductor laser device according to claim 2, further comprising a heavily-doped p-type region having a carrier concentration of 10$^{18}$ cm$^{-3}$ in at least a portion of a p-type layer proximate at least a portion of the active layer.

5. The semiconductor laser device according to claim 1, wherein $\lambda p-100 \leq \lambda g \leq \lambda p+100$, where a composition wavelength of the diffraction grating layer is $\lambda$g (nm) and an oscillation wavelength is $\lambda$p (nm).

6. The semiconductor laser device according to claim 2, wherein $\lambda p-100 \leq \lambda g \leq \lambda p+100$, where a composition wavelength of the diffraction grating layer is $\lambda$g (nm) and an oscillation wavelength is $\lambda$p (nm).

7. The semiconductor laser device according to claim 3, wherein $\lambda p-100 \leq \lambda g \leq \lambda p+100$, where a composition wavelength of the diffraction grating layer is $\lambda$g (nm) and an oscillation wavelength is $\lambda$p (nm).

8. The semiconductor laser device according to claim 4, wherein $\lambda p-100 \leq \lambda g \leq \lambda p+100$, where a composition wavelength of the diffraction grating layer is $\lambda$g (nm) and an oscillation wavelength is $\lambda$p (nm).

9. The semiconductor laser device according to claim 1, wherein a highly-refractive portion of the diffraction grating layer has a length longer than that of a low-refractive portion of the diffraction grating layer in the optical waveguide direction.

10. The semiconductor laser device according to claim 2, wherein a highly-refractive portion of the diffraction grating layer has a length longer than that of a low-refractive portion of the diffraction grating layer in the optical waveguide direction.

11. The semiconductor laser device according to claim 3, wherein a highly-refractive portion of the diffraction grating layer has a length longer than that of a low-refractive portion of the diffraction grating layer in the optical waveguide direction.

12. The semiconductor laser device according to claim 4, wherein a highly-refractive portion of the diffraction grating layer has a length longer than that of a low-refractive portion of the diffraction grating layer in the optical waveguide direction.

13. The semiconductor laser device according to claim 5, wherein a highly-refractive portion of the diffraction grating layer has a length longer than that of a low-refractive portion of the diffraction grating layer in the optical waveguide direction.

14. The semiconductor laser device according to claim 6, wherein a highly-refractive portion of the diffraction grating layer has a length longer than that of a low-refractive portion of the diffraction grating layer in the optical waveguide direction.

15. The semiconductor laser device according to claim 7, wherein a highly-refractive portion of the diffraction grating layer has a length longer than that of a low-refractive portion of the diffraction grating layer in the optical waveguide direction.

16. The semiconductor laser device according to claim 8, wherein a highly-refractive portion of the diffraction grating layer has a length longer than that of a low-refractive portion of the diffraction grating layer in the optical waveguide direction.

* * * * *